(12) United States Patent
Maeno

(10) Patent No.: US 9,216,478 B2
(45) Date of Patent: Dec. 22, 2015

(54) SOLDER AND DIE-BONDING STRUCTURE

(71) Applicant: KABUSHIKI KAISHA TOYOTA JIDOSHOKKI, Aichi-ken (JP)

(72) Inventor: Kazuhiro Maeno, Kariya (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 0 days.

(21) Appl. No.: 14/146,086

(22) Filed: Jan. 2, 2014

(65) Prior Publication Data

US 2014/0225269 A1 Aug. 14, 2014

(30) Foreign Application Priority Data

Feb. 13, 2013 (JP) ................................. 2013-025975

(51) Int. Cl.
| | |
|---|---|
| H01L 23/48 | (2006.01) |
| H01L 23/52 | (2006.01) |
| H01L 29/40 | (2006.01) |
| C22C 18/00 | (2006.01) |
| C22C 18/04 | (2006.01) |
| B23K 35/28 | (2006.01) |
| B23K 35/26 | (2006.01) |
| H01L 23/00 | (2006.01) |

(52) U.S. Cl.
CPC ............. *B23K 35/282* (2013.01); *B23K 35/264* (2013.01); *B23K 35/286* (2013.01); *H01L 24/29* (2013.01); *H01L 24/27* (2013.01); *H01L 24/32* (2013.01); *H01L 24/83* (2013.01); *H01L 2224/2711* (2013.01); *H01L 2224/27334* (2013.01); *H01L 2224/29118* (2013.01); *H01L 2224/32227* (2013.01); *H01L 2224/8309* (2013.01); *H01L 2224/83192* (2013.01); *H01L 2224/83424* (2013.01); *H01L 2224/83447* (2013.01); *H01L 2224/83815* (2013.01); *H01L 2924/351* (2013.01)

(58) Field of Classification Search
None
See application file for complete search history.

(56) References Cited

U.S. PATENT DOCUMENTS

| | | | | |
|---|---|---|---|---|
| 3,807,033 | A * | 4/1974 | Schoer et al. ................. | 228/221 |
| 3,900,151 | A * | 8/1975 | Schoer et al. ................. | 228/220 |
| 5,547,758 | A * | 8/1996 | Watanabe et al. ............ | 428/413 |
| 5,550,407 | A * | 8/1996 | Ogashiwa ..................... | 257/737 |
| 6,367,683 | B1 * | 4/2002 | Rass et al. .................... | 228/121 |
| 6,649,127 | B2 * | 11/2003 | Habu et al. .................... | 420/561 |
| 8,834,652 | B2 * | 9/2014 | Takahashi et al. ............ | 148/441 |
| 8,845,828 | B2 * | 9/2014 | Iseki ............................. | 148/441 |
| 2003/0007885 | A1 * | 1/2003 | Domi et al. ................... | 420/557 |
| 2003/0091462 | A1 * | 5/2003 | Chang et al. .................. | 420/514 |
| 2005/0029666 | A1 * | 2/2005 | Kurihara et al. .............. | 257/772 |
| 2011/0291282 | A1 * | 12/2011 | Yamada et al. ................ | 257/772 |
| 2012/0175020 | A1 * | 7/2012 | Imamura et al. ............... | 148/24 |
| 2013/0045131 | A1 * | 2/2013 | Li et al. ......................... | 420/516 |
| 2013/0251587 | A1 * | 9/2013 | Iseki ............................. | 420/519 |

(Continued)

FOREIGN PATENT DOCUMENTS

| | | | | |
|---|---|---|---|---|
| JP | | 3850135 B2 | 10/1999 | |
| JP | | 11288955 A | * 10/1999 | ............. H01L 21/52 |

(Continued)

*Primary Examiner* — Hoang-Quan Ho
(74) *Attorney, Agent, or Firm* — Greenblum & Bernstein, P.L.C.

(57) ABSTRACT

A solder includes zinc as a main component and the solder contains 6 to 8 mass percent of indium. A solder includes zinc as a main component, wherein the solder contains only indium. In a die-bonding structure in which a semiconductor chip is connected to a bonded member by a solder, the solder made of zinc as a main component and contains indium.

2 Claims, 1 Drawing Sheet

(56) References Cited

U.S. PATENT DOCUMENTS

2014/0042603 A1* 2/2014 Hosseini et al. ............. 257/676
2014/0210086 A1* 7/2014 Shimizu et al. ............. 257/751

FOREIGN PATENT DOCUMENTS

| | | | | |
|---|---|---|---|---|
| JP | | 2006255784 A | * | 9/2006 |
| WO | WO 2014114225 A1 | | * | 7/2014 |

* cited by examiner

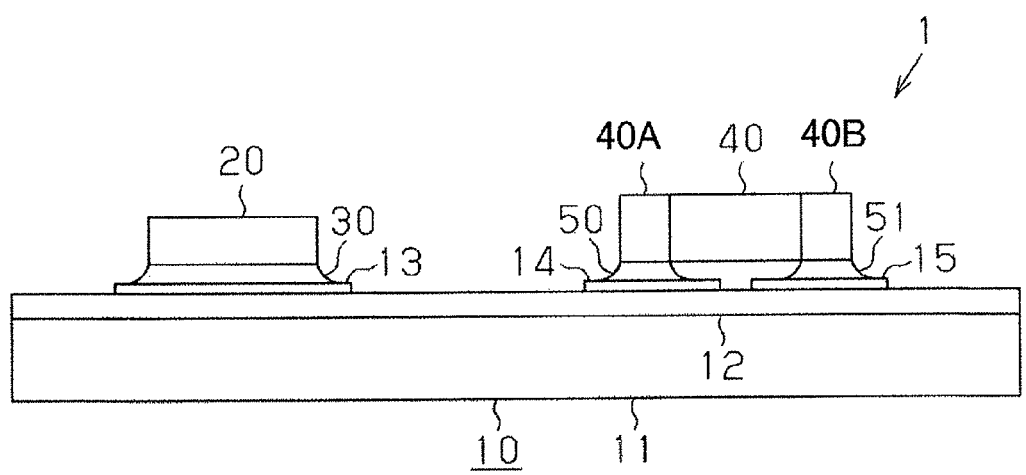

SOLDER AND DIE-BONDING STRUCTURE

BACKGROUND OF THE INVENTION

The present invention relates to a solder and a die-bonding structure.

Unlike low-temperature solder which has been already practically used, high-temperature lead-free solder is yet to be put into practical use because of many technical problems to address. In accordance with the recent development of solder technology, candidate solders of various types for lead-free capability have been proposed. Japanese Patent No. 3850135 discloses one example of solder which is made of zinc (Zn) as a main component and contains small amount of aluminum (Al) and germanium (Ge) thereby to lower the melting point of the solder. Such solder with a low melting point is used advantageously in assembling of electronic components.

It is desired that die-bonding solder should have an improved thermal shock resistance. The present invention is directed to providing a solder that has an improved thermal shock resistance and a die-bonding structure in which the solder is used.

SUMMARY OF THE INVENTION

In accordance with the present invention, a solder includes zinc as a main component and the solder contains 6 to 8 mass percent of indium. A solder includes zinc as a main component and the solder contains only indium. In a die-bonding structure, a semiconductor chip is connected to a bonded member by a solder and the solder is made of zinc as a main component and contains indium.

Other aspects and advantages of the invention will become apparent from the following description, taken in conjunction with the accompanying drawings, illustrating by way of example the principles of the invention.

BRIEF DESCRIPTION OF THE DRAWING

The invention together with objects and advantages thereof, may best be understood by reference to the following description of the presently preferred embodiments together with the accompanying drawings in which:

FIG. 1 is a schematic front view showing a semiconductor device using a solder according to a preferred embodiment of the present invention.

DETAILED DESCRIPTION OF THE PREFERRED EMBODIMENT

The following will describe a first preferred embodiment of the present invention with reference to FIG. 1. Referring to FIG. 1, reference numeral 1 designates a semiconductor device 1 which is adapted for use in a vehicle and in which a bare element 20 as a semiconductor chip is die-bonded to a metal circuit board 10 by a solder 30. The solder 30 is high-temperature lead-free solder. A chip component 40, such as a chip resistor, including electrodes 40A and 40B is connected to the metal circuit board 10 by solders 50, 51. The solders 50, 51 are low-temperature solder.

The metal circuit board 10 includes a metal plate 11, an insulating layer 12 formed on the top surface of the metal plate 11 and conductor patterns 13, 14, 15 formed on the top surface of the insulating layer 12. The metal plate 11 is made of an aluminum alloy or a copper alloy. The insulating layer 12 is made of a resin material. The conductor patterns 13, 14, 15 are made of either a copper alloy or an aluminum alloy. When an aluminum alloy is employed for the conductor patterns 13, 14, 15, soldered portions for soldering should preferably be electroplated.

The metal circuit board 10 is prepared for assembling of the semiconductor device 1. In the metal circuit board 10, the insulating layer 12 is formed on the top surface of the metal plate 11 and the conductor patterns 13, 14, 15 are formed on the top surface of the insulating layer 12. High-temperature lead-free solder is provided on the conductor pattern 13 formed on the metal circuit board 10 in the form of a thin plate without using flux. Then, the bare element 20 is placed on the solder 30 and reflow soldering is performed, thus the bare element 20 being die-bonded to the metal circuit board 10 by the solder 30 of high-temperature lead-free solder. Subsequently, solder paste of low-temperature solder is printed on the conductor patterns 14, 15 of the metal circuit board 10, on which the chip component 40 is placed, and reflow soldering is performed, with the result that the chip component 40 is connected to the metal circuit board 10 by the solders 50, 51 of low-temperature solder. Specifically, the electrode 40A of the chip component 40 is connected to the conductor pattern 14 by the solder 50 and the electrode 40B of the chip component 40 is connected to the conductor pattern 15 by the solder 51. Thus, the bare element 20 and the chip component 40 are mounted on the metal circuit board 10 in this stepping soldering process.

The solder 30 is made of zinc as a main component and contains indium (In) which is a minor metal, which helps to improve the property of the solder 30, specifically, the thermal shock resistance of the solder 30. The solder 30 should preferably contain about 6 to 8 mass percent of indium. The solder 30 may further contain bismuth (Bi), phosphorus (P) and germanium (Ge). Furthermore, the solder 30 may further contain aluminum. The content of Aluminum should be about 5 mass percent and the content of germanium should be about 0.1 mass percent.

The solder 30 is made by adding indium in a Zn-based solder. The Zn-based solder may contain aluminum, germanium, magnesium, silver or copper, specifically such as Zn-5Al-0.1 Ge, Zn-5Al, Zn-5Al-0.05Mg, Zn-5Al-0.12Ag, Zn-5Al-0.2Ag, Zn-5Al-2Ag, Zn-5Al-0.1Cu, Zn-5Al-0.5Cu, Zn-5Al-1Cu or Zn-6Al-5Ge.

The following will describe an example of the solder 30. The solder 30 is made of high-temperature lead-free Zn-5Al-0.1Ge solder with addition of indium, bismuth and phosphorus in Zn-5Al-0.1Ge solder of high-temperature lead-free solder.

It is known in the art that the addition of indium in the solder lowers the melting point of the solder. In the development of low-temperature lead-free solder to be mounted on a metal circuit board, the inventor of the present application found out that indium contained in the solder reduces the stress concentration of the solder and greatly improves the thermal shock resistance of the solder. It is considered that the addition of indium, which has high malleability and ductility, improves the hardness and fragility of the solder.

In the case of Zn-based solder, especially Zn-5Al-0.1Ge solder, the addition of indium may greatly improve the thermal shock resistance of the solder that is important when mounting a component on the metal circuit board 10. However, the addition of an excessive amount of indium that is a costly metal increases the manufacturing cost of the semiconductor device 1. If the melting point of the solder is lowered more than necessary by addition of an excessive amount of indium, a hole forming deformation and a transformation occur in the solder when the solder is exposed to an environment at about 110 to 120 degrees Celsius for a long time.

Thus, the amount of indium for addition should preferably be in the range from 0.5 to 20 mass percent, and more preferably in the range from 6 to 8 mass percent.

If the amount of indium for addition is determined only in view of the reduction of the thermal shock resistance and of the cost, there is a fear that the melting point of solder is not sufficiently lowered and, therefore, the use of indium in combination with bismuth is effective to lower the melting point of the solder.

Though the addition of bismuth is effective to lower the melting point of the solder, it makes the solder hard and fragile, which lead to reduction of the thermal shock resistance.

In the development of low-temperature lead-free solder to be mounted on a metal circuit board, the inventor of the present application found that the thermal shock resistance of the solder is greatly improved and the mechanical strength of the solder is also improved by simultaneously adding indium and bismuth in an appropriate ratio. The effectiveness of bismuth to lower the melting point of the solder can lower the melting point of the solder to a desired temperature without increasing the amount of expensive metal of indium for addition. In the above-described amount of indium for addition, the amount of bismuth to be added should preferably be in the range from 0 to 5 mass percent, and more preferably 0.5 mass percent.

As compared with zinc, phosphorus tends to oxidize more easily and forms oxide film on the surface of the solder. Zinc is reduced by the oxidation of phosphorus and the subsequent form of the oxide film of phosphorus protects zinc from reoxidation, with the result that the wettability of Zn-based solder which tends to oxidize may be improved. In addition, since germanium contained in the solder as a base has the same effect as phosphorus, synergistic effect may be obtained. However, if the amount of phosphorus for addition is increased too much, soldering performance and reliability of solder are reduced and, therefore, addition of appropriate amount of phosphorus is important. The amount of phosphorus to be added should preferably be in the range from 0 to 5 mass percent, and more preferably 0.1 mass percent.

An example of solder containing indium, bismuth and phosphorus contains about 8 mass percent of indium, about 0.5 mass percent of bismuth and about 0.1 mass percent of phosphorus. The following will describe the function of the above-described solders.

The melting point of Zn-5Al-0.1Ge solder with no indium is 382 degrees Celsius. Since this melting point of 382 degrees Celsius is higher than the melting point of 304 degrees Celsius of Sn5 solder of high-temperature lead-based solder and lower than 400 degrees Celsius, the Sn5 solder can resist the temperature in the stepping soldering process and in the operation of the composite semiconductors, thus protecting the board and the components mounted on the board against thermal damage. The solder has an excellent formability that allows the solder to be reeled and palletized by cold rolling and, therefore, is applicable to die-bonding. Furthermore, the solder has an excellent wettability, that permits reduction of void formed in the solder by using a vacuum furnace. However, the Zn-5Al-0.1Ge solder which is harder and more fragile than Pb-based solder is susceptible to development of crack due to thermal shock. A metal circuit board which is usually used in a power module that produces a large amount of heat has a higher coefficient of liner expansion than a print circuit board, so that the thermal stress of the metal circuit board is extremely large. High-temperature solder is usually used for die-bonding. When a bare element for die-bonding is a power element, a large amount of heat is produced. Thus, the high-temperature solder is required to have a higher thermal shock resistance than the low-temperature solder. Since low-temperature solder is used for mounting of passive components that produces very small amount of heat, there is no problem if crack is formed in the solder but disconnection does not occur in circuit of the semiconductor device 1. On the other hand, since high-temperature solder needs to have a high radiating performance, it is not acceptable that generation of crack in the solder increases thermal resistance to a predetermined level even if disconnection does not occur in the circuit. In addition, a bare element is more fragile and tends to be broken more easily than passive components. Thus, thermal shock resistance is an extremely important property for the high-temperature solder. The composite semiconductors which operate under a higher temperature of about 300 degrees Celsius than silicon semiconductor are required to have still higher thermal shock resistance. The conventional Zn-based solder, especially Zn-5Al-0.1Ge solder has not yet accomplished the thermal shock resistance that can resist high thermal stress. The Zn-5Al-0.1Ge solder, whose melting point is 382 degrees Celsius, requires at least about 410 degrees Celsius for the actual soldering. In this case, there is a fear that such actual soldering temperature may cause the passive components and the substrate to be subjected to an excessive temperature that is beyond their permissible level of temperature. When using a metal circuit board, for example, the metal circuit board is required to improve its thermal resistance since the insulated layer of the metal circuit board is made of a resin material. The wettability of Zn-based solder is extremely lower than that of Pb-based solder. Especially, zinc itself is extremely easy to oxidize. In the case of mounting of a normal surface mounting device (SMD), past solder is usable and the wettability of solder may be improved to some extent due to action of flux. For die-bonding, however, paste solder is not usable and flux is not usable, either. Thus, the wettability of the solder itself is required to be improved without using flux.

According to this preferred embodiment, indium is added in the solder for improving its thermal shock resistance. In this case, addition of 6 to 8 mass percent of indium is effective to improve the thermal shock resistance of the solder. In addition to indium, bismuth and phosphorus are simultaneously added in the solder, more specifically, 6 to 8 mass percent of indium and 0.5 mass percent of bismuth are simultaneously added in the solder. By so adding, synergistic effects which cannot be obtained by separate addition of the additive elements may be achieved. Namely, when indium or bismuth is added in the solder, the melting point of the solder may be decreased. However, when bismuth alone is added in the solder, there is a fear that the thermal shock resistance of the solder is greatly decreased because of the embrittlement characteristics of bismuth, and when indium alone is added in the solder, the solder tends to be deformed easily under a high-temperature environment. Thus, adding predetermined amounts of indium and bismuth simultaneously in the solder, the problem with the embrittlement characteristic of bismuth may be solved and the deformation of the solder under a high-temperature environment caused by addition of indium alone may be prevented. The addition of both indium and bismuth acts as if to remove the disadvantages due to the separate addition of these elements, offering synergistic effect of improving the thermal shock resistance. As a matter of course, the inherent effect of indium and bismuth of decreasing the melting point of the solder is obtainable.

In order to obtain the above-described effect by simultaneous addition of indium and bismuth, the amounts of indium and bismuth for addition should preferably be in the range from 6 to 8 mass percent and 0.5 mass percent, respectively. Regarding the addition of phosphorus, simultaneous addition of phosphorus and germanium brings about a new synergistic effect. Specifically, a film of germanium is formed on the surface of Zn-based solder which prevents oxidation of zinc. Oxidize layer which is already formed on the surface of Zn-base solder is not sufficiently reduced to be removed, so that the wettability of the solder is not sufficiently improved. Meanwhile, since phosphorus is easy to oxidize in comparison with zinc, the oxidize layer already formed on the surface of Zn-base solder may be reduced to be removed by phosphorus. However, zinc is easy to oxidize and it is difficult to prevent subsequent reoxidation of zinc. Therefore, the wettability of Zn-based solder cannot be sufficiently improved. Simultaneously adding germanium and phosphorus in the solder, the oxide layer formed on the surface of zinc is reduced to be removed by phosphorus and a protection film made of germanium is formed on the surface of zinc to prevent reoxidation of zinc. Thus, excellent wettability of the solder may be obtained.

As described above, addition of 6 to 8 mass percent of Indium offers high thermal shock resistance of the solder. The minor component metals contained in the solder offer not only the generally known advantages such as the increased adhesion strength and the reduced solidus temperature of the solder, but also the improvement in the thermal shock resistance due to the addition of indium, the prevention of reoxidation of zinc by the protection film formed by germanium and the reduction by phosphorus. In addition, adding simultaneously predetermined amounts of indium, bismuth, germanium and phosphorus in the solder, synergistic effects which cannot be obtained by separate addition of the additive elements may be obtained.

The above-described embodiment offers the following advantageous effects.

(1) The solder 30 which is made of zinc as a main component and contains 6 to 8 mass percent of indium has an improved thermal shock resistance.

(2) The solder 30 further contains bismuth, so that the mechanical strength of the solder 30 may be improved.

(3) The solder 30 further contains phosphorus and germanium, which improves the wettability of the solder 30.

(4) The solder 30 further contains aluminum, so that the formability of the solder 30 may be improved.

(5) In the case of above solder 30, the addition of 5 mass percent of aluminum and 0.1 mass percent of germanium improves the wettability of the solder 30.

(6) In the die-bonding structure in which the bare element 20 as a semiconductor chip is bonded through the solder 30 to the metal circuit board 10, the solder 30 is made of zinc as a main component and contains indium. Thus, the thermal shock resistance of the solder 30 may be improved.

(7) In the die-bonding structure according to the above item (6), it is practically preferable that the solder 30 should contain 6 to 8 mass percent of indium.

(8) The solder 30 further containing aluminum improves its formability.

(9) In the case of the above solder, the addition of the content of 5 mass percent of aluminum and 0.1 mass percent of germanium improves the wettability of the solder 30.

(10) In the above items (6) through (9), it is practically preferable that the solder 30 should be used in a vehicle.

The present invention may be practiced in various ways as exemplified below.

The solder 30 may contain only indium, for example 8 mass percent of indium, dispensing with bismuth and phosphorus. The solder 30 may be made of zinc as a main component and may contain only indium. In the case of this solder, its thermal shock resistance may also be improved.

The solder 30 may contain only indium and bismuth, for example 8 mass percent of indium and 0.5 mass percent of bismuth, dispensing with phosphorus. Furthermore, the solder 30 may contain only indium and phosphorus, for example 8 percent indium and 0.1 mass percent of phosphorus, dispensing with bismuth.

According to the preferred embodiment of the present invention, the solder 30 is a Zn-based solder containing germanium. Alternatively, the solder 30 may be formed by adding germanium in Zn-based solder.

According to the preferred embodiment of the present invention, the stepping soldering process is performed. Alternatively, composite semiconductor made of silicon carbide (SiC) or gallium nitride (GaN) may be mounted on a board by high-temperature lead-free solder.

What is claimed is:

1. A solder comprising zinc as a main component, bismuth, phosphorous, 6 to 8 mass percent of indium, 5 mass percent of aluminum, and 0.1 mass percent of germanium.

2. A solder comprising zinc as a main component, wherein the solder further comprises 8 mass percent of indium and 0.5 mass percent of bismuth or 0.1 mass percent of phosphorous.

* * * * *